(12) United States Patent
Faurie et al.

(10) Patent No.: US 9,064,685 B2
(45) Date of Patent: Jun. 23, 2015

(54) SEMICONDUCTOR SUBSTRATE AND METHOD OF FORMING

(71) Applicant: Saint-Gobain Cristaux Et Detecteurs, Courbevoie (FR)

(72) Inventors: Jean-Pierre Faurie, Valbonne (FR); Bernard Beaumont, Le Tignet (FR)

(73) Assignee: Saint-Gobain Cristaux Et Detecteurs, Courbevoie (FR)

( * ) Notice: Subject to any disclaimer, the term of this patent is extended or adjusted under 35 U.S.C. 154(b) by 0 days.

(21) Appl. No.: 14/550,396

(22) Filed: Nov. 21, 2014

(65) Prior Publication Data

US 2015/0076512 A1 Mar. 19, 2015

Related U.S. Application Data

(63) Continuation of application No. 13/535,509, filed on Jun. 28, 2012, now Pat. No. 8,921,210.

(60) Provisional application No. 61/501,983, filed on Jun. 28, 2011.

(51) Int. Cl.
| | |
|---|---|
| *H01L 29/20* | (2006.01) |
| *H01L 21/02* | (2006.01) |
| *H01L 23/14* | (2006.01) |

(52) U.S. Cl.
CPC .... *H01L 21/02005* (2013.01); *H01L 21/02389* (2013.01); *H01L 21/02458* (2013.01); *H01L 21/02507* (2013.01); *H01L 21/02664* (2013.01); *H01L 23/14* (2013.01)

(58) Field of Classification Search
None
See application file for complete search history.

(56) References Cited

U.S. PATENT DOCUMENTS

| | | | |
|---|---|---|---|
| 6,498,113 B1 | 12/2002 | Solomon et al. | |
| 7,282,381 B2 | 10/2007 | Feltin et al. | |
| 7,732,301 B1 | 6/2010 | Pinnington et al. | |
| 2002/0013042 A1 | 1/2002 | Morkoc | |
| 2006/0228901 A1 | 10/2006 | Yoon et al. | |
| 2007/0034892 A1 | 2/2007 | Song | |
| 2007/0141823 A1 | 6/2007 | Preble et al. | |
| 2008/0108171 A1 | 5/2008 | Rogers et al. | |
| 2010/0219505 A1* | 9/2010 | D'Evelyn | 257/615 |

OTHER PUBLICATIONS

"Laser Lift-off & Film Transfer," <http://www.mse.berkeley.edu/groups/Sands/HEMI/Liftoff.html>, printed Dec. 14, 2010, 5 pages.
The International Search Report and the Written Opinion for International Application No. PCT/US2012/044508 received from the International Searching Authority (ISA/KR), dated Jan. 7, 2013, 10 pages.

* cited by examiner

*Primary Examiner* — Zandra Smith
*Assistant Examiner* — Molly Reida
(74) *Attorney, Agent, or Firm* — Abel Law Group, LLP; Robert N. Young

(57) ABSTRACT

A method of forming a semiconductive substrate material for an electronic device including forming a plurality of semiconductive layers on a substrate during a continuous growth process in a reaction chamber, wherein during the continuous growth process, a release layer is formed between a base layer and an epitaxial layer by altering at least one growth process parameter during the continuous growth process. The method also including separating the plurality of semiconductive layers from the substrate.

20 Claims, 4 Drawing Sheets

SEMICONDUCTOR SUBSTRATE AND METHOD OF FORMING

CROSS-REFERENCE TO RELATED APPLICATIONS

This application is a continuation application of and claims priority under 35 U.S.C. §120 to U.S. patent application Ser. No. 13/535,509, filed Jun. 28, 2012, entitled "Semiconductor Substrate and Method of Forming" naming inventors Faurie et al, which claims priority under 35 U.S.C. §119(e) to U.S. Provisional Patent Application No. 61/501,983 entitled "Semiconductor Substrate and Method of Forming," by Faurie et al., filed Jun. 28, 2011, both of which are assigned to the current assignee hereof and incorporated herein by reference in their entireties.

FIELD OF THE DISCLOSURE

The following is directed to a method of forming a semiconductive substrate, and particularly a substrate including a release layer for use in forming LED or LD devices.

DESCRIPTION OF THE RELATED ART

Semiconductive-based compounds, including Group III-V materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission electronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material.

The existence of extended defects (threading dislocations, stacking faults, and antiphase boundaries) leads to significantly deteriorated performances and results in a shortened operating lifetime of devices. More specifically, the dislocations behave as nonradiative centres, thus reducing the light-emitting efficiency of light-emitting diodes and laser diodes made from these materials. These dislocations also increase the dark current. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations can act as strong scattering centres for carriers, thus reducing the mobility of electrons and holes, limiting the performance of many semiconductor devices.

SUMMARY

According to one aspect, a method of forming a semiconductive substrate material for an electronic device includes forming a plurality of semiconductive layers on a substrate during a continuous growth process in a reaction chamber, wherein during the continuous growth process, a release layer is formed between a base layer and an epitaxial layer by altering at least one growth process parameter during the continuous growth process and separating the plurality of semiconductive layers from the substrate.

According to another aspect, a method of forming a Group III-V material includes forming a base layer comprising a Group III-V material overlying a substrate, forming a release layer comprising a Group III-V material overlying the base layer, wherein the release layer comprises a concentration of a dopant in a different amount than a concentration of the dopant in the base layer, and forming an epitaxial layer comprising a Group III-V material overlying the base layer. In particular, the process is conducted in a single chamber in a continuous growth process.

In one aspect, a method of forming a semiconductive substrate material for an electronic device includes conducting a continuous growth process to form a plurality of semiconductive layers on a substrate, the continuous growth process includes forming a base layer comprising a Group III-V material overlying the substrate and continuously growing the Group III-V material while changing at least one growth process parameter to form a release layer overlying the base layer, the release layer having a composition different that a composition of the base layer. The method further includes continuously growing the Group III-V material and changing at least one process parameter to form an epitaxial layer overlying the release layer, the epitaxial layer having a composition different than a composition of the release layer.

In still another aspect, a method of forming a semiconductive substrate material for an electronic device includes forming a base layer comprising a Group III-V material overlying a substrate in a reaction chamber, wherein depositing the base layer comprises a hydride vapor phase epitaxy (HVPE) process and continuing to grow the Group III-V material and introducing a first dopant material into the reaction chamber to form a first release layer overlying the base layer. The method further includes continuing to grow the Group III-V material and removing the dopant from the reaction chamber to form a first epitaxial layer portion overlying the release layer, continuing to grow the Group III-V material and introducing a second dopant material into the reaction chamber to form a second release layer overlying the first epitaxial layer portion, and separating the first epitaxial layer portion from the base layer at the first release layer using radiation of a first wavelength impinging on the first release layer.

In still another aspect, a semiconductor device including a base layer comprising a Group III-V material, a first release layer comprising a Group III-V material overlying the base layer, a first epitaxial layer portion comprising a Group III-V material overlying the first release layer, the first epitaxial layer portion comprising a dislocation density within a range between about $1 \times 10^5$ dislocations/cm2 and about $1 \times 10^8$ dislocations/cm2 as measured at an upper surface of the first epitaxial layer portion.

According to another aspect, a semiconductor device includes a base layer comprising a Group III-V material, a first release layer comprising a Group III-V material overlying the base layer, a first epitaxial layer portion comprising a Group III-V material overlying the first release layer, a second release layer comprising a Group-III-V material overlying the first epitaxial layer portion, and a second epitaxial layer portion comprising a Group III-V material overlying the second release layer.

A semiconductor device includes a base layer comprising a Group III-V material, a first release layer comprising a Group III-V material overlying the base layer, a first epitaxial layer portion comprising a Group III-V material overlying the first release layer, a second release layer comprising a Group-III-V material overlying the first epitaxial layer portion, and a second epitaxial layer portion comprising a Group III-V material overlying the second release layer.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

The following is generally directed to substrate materials, and particular, substrates having a plurality of semiconductive layers (i.e., semiconductive substrates) and methods of forming such articles. The semiconductive substrate may include Group III-V materials including for example gallium nitride (GaN). It will be appreciated that reference to Group III-V materials, include compounds including at least one element from Group III of the Periodic Table of Elements and at least one element from Group V of the Periodic Table of Elements.

Figure 1:
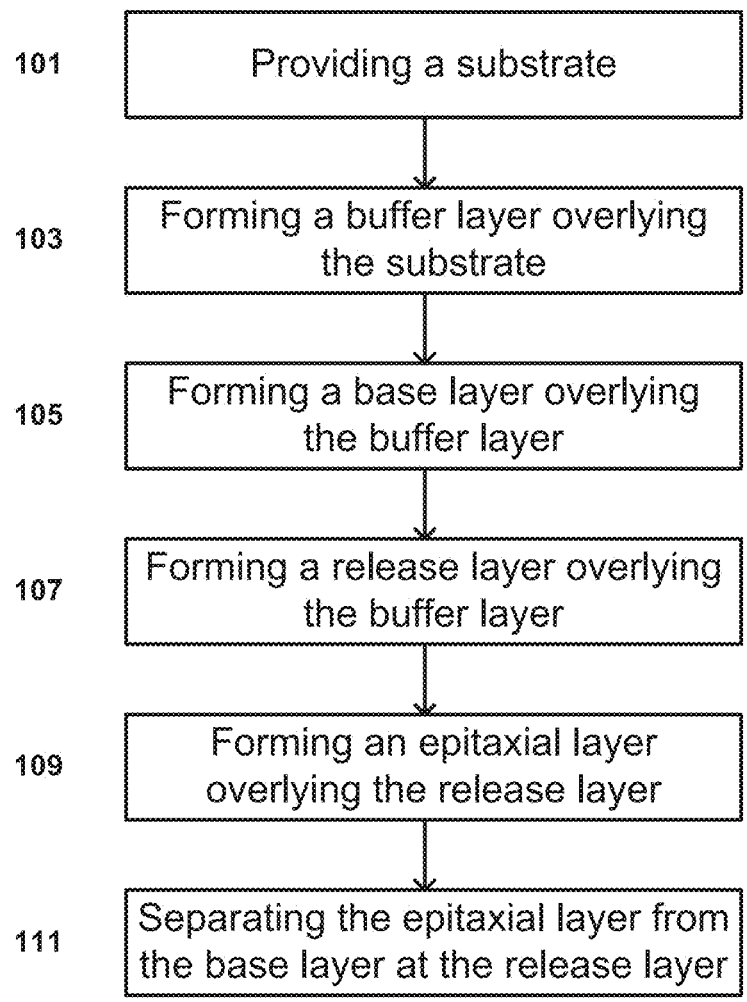
FIG. 1 includes a flowchart providing a method of forming a semiconductive substrate material for an electronic device in accordance with embodiment.

FIG. 1 includes a flow chart illustrating a method of forming a semiconductive substrate material in accordance with the embodiment. As illustrated, the process is initiated at step 101 by providing a substrate. The substrate can be a structure suitable for supporting a plurality of layers thereon. The substrate may further provide a structure and surface suitable for conducting heteroepitaxial growth of semiconductive layers thereon. In accordance with one embodiment, the substrate can be an inorganic material. Some suitable inorganic materials can include oxides, carbides, nitrides, borides, oxycarbides, oxyborides, oxynitrides, and a combination thereof. In certain instances the substrate can include alumina, and more particularly, may include single crystal alumina (i.e., sapphire). One embodiment utilizes a substrate consisting essentially of sapphire.

Figure 2A:
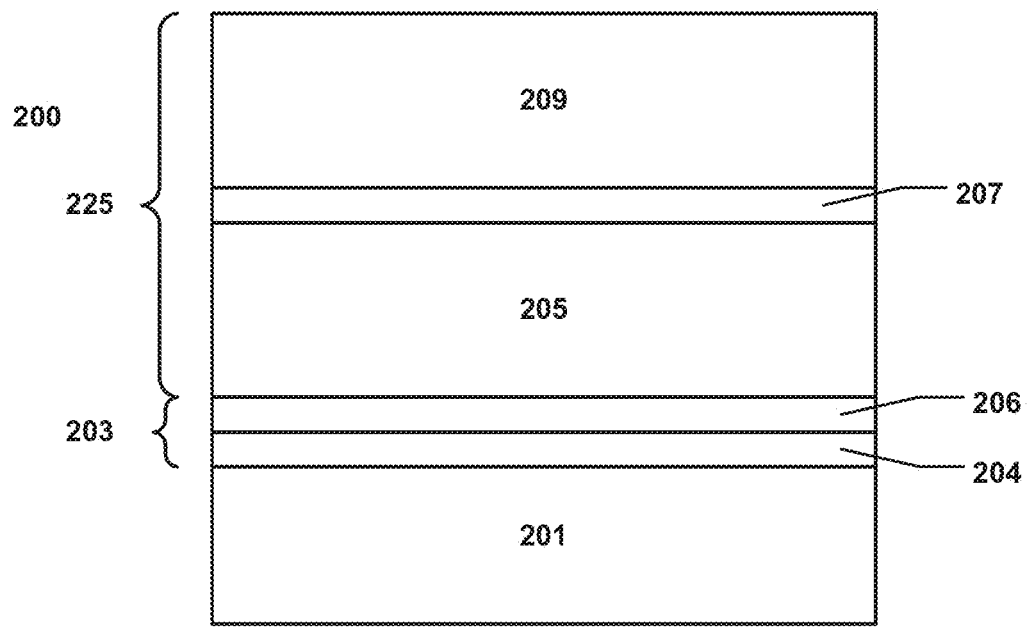
FIGS. 2A-2D includes illustrations of a semiconductive substrate forming process in accordance embodiment.

The process can continue at step 103 by forming a buffer layer overlying the substrate. Turning briefly to FIG. 2A, a semiconductive substrate 200 is illustrated in accordance with embodiment. Notably, the semiconductive substrate 200 can include a substrate 201 and a buffer layer 203 overlying the substrate 201. In particular, the buffer layer 203 can overlie an upper major surface of the substrate 201, and more particularly, the buffer layer 203 can be in direct contact with upper major surface of the substrate 201.

Forming the buffer layer 203 can include a deposition process. For example, the buffer layer 203 can be deposited on an upper major surface of the substrate 201 within a reaction chamber. According to one process, the substrate can be loaded into a reaction chamber, and after providing a suitable environment within the reaction chamber, a buffer layer can be deposited on the substrate. According to one embodiment, a suitable deposition technique can include chemical vapor deposition. In one particular instance, the deposition process can include metal-organic chemical vapor deposition (MOCVD).

The buffer layer 203 may be formed from a plurality of films. For example, as illustrated in FIG. 2A, the buffer layer 203 can include a film 204 and a film 206. In accordance with an embodiment, at least one of the films, can include a crystalline material. In more particular instances, the film 204, which can be in direct contact with the surface of the substrate 201, can include silicon, and may consist essentially of silicon. The film 204 may facilitate separation between the substrate 201 and semiconductive layers overlying the film 204 as described herein.

As illustrated in FIG. 2A, the film 206 can overly, and more particularly, can be in direct contact with the film 204. The film 206 can have suitable crystallographic features for epitaxial formation of layers thereon. Notably, in one embodiment the film 204 can include a semiconductive material. Suitable semiconductive material can include a Group III-V material. In one particular instance, the film 206 can include a nitride material. In another example, the film 206 can include gallium, aluminum, indium and a combination thereof. Still, in one particular embodiment, the film 206 can comprise aluminum nitride, and more particularly, may consist essentially of aluminum nitride.

Accordingly, in an exemplary structure, the buffer layer 203 can be formed such that the film 204 includes silicon and is directly contacting a major surface of the substrate 201. Furthermore, the film 206 can directly contact a surface of the film 204 and include a Group III-V material.

After forming a buffer layer at step 103, the process can continue at step 105 by forming a base layer overlying the buffer layer 203. Referring briefly to FIG. 2A, the semiconductive substrate 200 can include a base layer 205 overlying the buffer layer 203. In particular, the base layer 205 can be formed such it is overlying a surface of the buffer layer 203, and more particularly, the base layer can be in direct contact with the film 206 of the buffer layer 203.

According to an embodiment, upon suitably forming a buffer layer 203, the substrate 201 and buffer layer 203 may be placed within a reaction chamber to conduct a continuous growth process. A continuous growth process can include a process that is carried out in a single chamber, without removing the work piece (e.g., semiconductive substrate) from the chamber. A continuous growth process can also include a growth process, such as an epitaxial growth process, wherein a series of semiconductive layers can be formed without significant cooling of the work piece from the growth temperature, such that all layers can be formed with each other in-situ. A continuous growth process can further include a growth process wherein all semiconductive layers are formed using the same process (e.g., hydride vapor phase epitaxy), and within the same temperature, at substantially the same growth temperature, but the semiconductive layers may have different characteristics. For example, the chemical composition of the semiconductive layers can differ from each other, such that during the continuous growth process, a series of semiconductive layers can be formed, wherein the chemical composition of abutting layers can be different through modification of growth parameters.

In accordance with the embodiment, the continuous growth process can utilize an epitaxial growth process. More particularly, the continuous growth process can include hydride vapor phase epitaxy (HVPE). Accordingly, the base layer 205 can be formed through an epitaxial growth process, such as hydride vapor phase epitaxy (HVPE).

In one particular instance, the base layer 205 can be made of a Group III-V material. Some suitable Group III-V materials can include nitride materials. Furthermore, the base layer 205 may include gallium. In particular instances, the base layer 205 may include gallium nitride (GaN), and more particularly may consist essentially of gallium nitride.

Particular methods of forming the base layer 205 can be undertaken. For example, the epitaxial growth of the base layer material can be conducted in various growth modes. For example, in one embodiment the base layer is initially formed as an epitaxial layer grown in a 3-dimensional (3D) growth mode. A 3D growth mode can include the simultaneous growth of the base layer 205 material along multiple crystallographic directions. In such instances, formation of the base layer 205 in a 3D growth process can include spontaneous formation of island features on the buffer layer 203. The spontaneously formed island features can be randomly positioned on the buffer layer 203, defining various mesas having multiple facets and valleys between the mesas.

Alternatively, or additionally, forming of the base layer 205 can include epitaxial growth in a 2-dimensional (2D) growth mode. A 2D growth mode is characterized by preferential growth of the material in one crystallographic direction and limited growth of the crystalline material along other crystallographic directions. For example, in one embodiment, formation of a base layer 205 comprising GaN in a 2D growth mode includes preferential growth of the GaN in the c-plane (0001), such that vertical growth of the base layer material is stabilized over lateral growth.

Still, forming of the base layer can incorporate a combination of 3D and 2D growth modes. For example, the base layer 205 may be initially formed in a 3D growth mode, wherein island features are spontaneously formed on the buffer layer 203 as a non-continuous layer of material. Following the 3D growth mode, growth parameters can be altered to change to a 2D growth mode, wherein vertical growth is accelerated over lateral growth. Upon switching from a 3D growth mode to a 2D growth mode, the spontaneously formed islands may coalesce into a continuous layer of uniform thickness. Combining 3D and 2D growth modes can facilitate formation of a base layer having desirable characteristics, such as a particular dislocation density.

Certain growth parameters include growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases including for example noble gases, inert gases, and the like. In particular instances the non-reactant material can include gases such as nitrogen and or hydrogen.

During formation of the base layer 205, including production of the base layer 205 in a 3D growth mode, the growth temperature can be at least about 750° C. In other embodiments, the growth temperature can be greater, such as at least about 800° C., at least about 850° C., at least about 875° C., at least about 900° C., or even at least about 925° C. According to one method of forming, the growth temperature during formation of the base layer 205 can be not greater than about 1200° C., such as not greater than about 1150° C., not greater than about 1125° C., not greater than about 1050° C., or even not greater than about 1000° C. It will be appreciated that the growth temperature can be within a range between any of the minimum and maximum values noted above.

For certain processes, the growth temperature may be changed to facilitate a change between 3D and 2D growth modes. For example, in changing from 3D to 2D growth modes, the temperature may be changed by at least about 5° C., such as at least about 10° C., at least about 15° C., at least about 20° C., at least about 30° C., at least about 35° C., or even at least about 40° C. In still other embodiments, in changing from a 3D to 2D growth mode, the growth temperature can be changed by not greater than about 100° C., such as not greater than about 90° C., not greater than about 80° C., not greater than about 70° C., or even not greater than about 60° C. Change of the growth temperature can include an increase in the growth temperature in changing from 3D to 2D growth modes. It will be appreciated that the change in growth temperature can be within a range between any of the minimum and maximum values noted above.

In accordance with embodiment, the process of forming the base layer 205 can be conducted at a growth rate of at least 50 microns per hour. In other embodiments, the rate of forming the base layer 205 can be greater, such as at least about 75 micron per hours, at least about 100 microns per hour, at least about 150 microns per hour, at least about 200 microns per hour, or even at least about 250 microns per hour. Another embodiment, the process of forming the base layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, in changing from 3D to 2D growth, the growth rate may be changed by at least about 5 microns per hour, such as at least about 10 microns per hour, at least about 15 microns per hour, at least about 20 microns per hour, at least about 40 microns per hour, at least about 50 microns per hour, or even at least about 75 microns per hour. In still other embodiments, in changing from a 3D to 2D growth mode, the growth rate can be changed by not greater than about 200 microns per hour, such as not greater than about 175 microns per hour, not greater than about 150 microns per hour, not greater than about 125 microns per hour, or even not greater than about 100 microns per hour. It will be appreciated that the change in growth rate can be a decrease in the growth rate when changing from a 3D to a 2D growth mode. It will be appreciated that the change in growth rate can be within a range between any of the minimum and maximum values noted above.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained.

And still, in another embodiment, both the growth rate and growth temperature may be changed to effectuate the change in growth modes.

After suitably forming the base layer 205, the average thickness of the base layer 205 can be not great than about 5 mm In other embodiments, the average thickness of the base layer 205 can be less, such as not greater than about 4 mm, not greater than 3 mm, not greater than about 2 mm, or even not greater than about 1.5 mm Still, it will be appreciated that the base layer 205 can be formed such as that it has an average thickness of at least about 0.1 mm, such at least 0.2 mm, at least 0.5 mm, at least 0.8, or even at least 1 mm. It will be appreciated that the base layer 205 can have an average thickness within a range of any of the minimum of maximum values noted above, including for example, within a range between 0.1 mm and about 5 mm.

The base layer 205 can be formed to have a particular dislocation density. The dislocation density of the base 205 can be measured at the upper surface of the base layer upon forming A suitable method of measuring the dislocation density includes use of cathode luminescence microscopy operated at room temperature and polychromatic light detection without monochromator under 10 keVe-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 μm$^2$. For a dislocation density measurement of approximately $10^6$ cm$^{-2}$, the magnification is typically 500-1000× and the area is typically 0.1 mm$^2$ For example, the base layer 205 can have a dislocation of density not greater than about 1×10$^8$ dislocation/cm$^2$, as measured at an upper surface of the base layer 205. In other embodiments, the dislocation density of the base layer 205 can be less, such that it is not greater than about 1×10$^7$ dislocation/cm$^2$, not greater than about 6×10$^6$ dislocation/cm$^2$, or even not greater than about 1×10$^6$ dislocation/cm$^2$. Still, the base layer 205 may have a dislocation density that is at least about 1×10$^5$ dislocation/cm$^2$, such as at least 2×10$^5$ dislocation/cm$^2$, at least 3×10$^5$ dislocation/cm$^2$, or even at least 5×10$^5$ dislocation/cm$^2$. It will be appreciated that the base layer can have a dislocation density within a range within any of the minimum and maximum values noted above.

The base layer 205 may be formed such as that it has a particular absorption coefficient with respect to a particular wavelength of radiation. For example, radiation within the visible spectrum, which includes radiation having a wavelength between about 350 nanometers and about 800 nanometers. In certain instances, the base layer 205 can have an absorption coefficient of not great than about 50 cm$^{-1}$. In other embodiments, the base layer 205 can be formed such as it has an absorption coefficient of not greater than about 25 cm$^{-1}$ such as not greater than about 15 cm$^{-1}$, not about greater 10 cm$^{-1}$, or even not great than about 5 cm$^{-1}$. In other embodiments the base layer 205 may have an absorption coefficient that is at least about 0.1 cm$^{-1}$, such as at least 0.2 cm$^{-1}$, at least 0.5 cm$^{-1}$, at least about 1 cm$^{-1}$, or even at least about 2 cm$^{-1}$ for radiation within the visible spectrum. It will be appreciated that the base layer 205 can have an absorption coefficient within range between any of the minimum and maximum values noted above.

After forming the base layer at step 105, the process can continue at step 107 by forming a release layer overlying the base layer. Referring briefly to FIG. 2A, the semiconductive substrate 200 includes a release layer 207 overlying the base layer 205. In particular, the release layer 207 can be formed in-situ with the base layer 205 in a continuous growth process. In accordance with a particular embodiment, the release layer 207 can be formed overlying the base layer during the continuous growth process. Notably, the formation of the release layer 207 can be facilitated by a change in certain growth process parameters that facilitate the change in epitaxial conditions used during formation of the base layer 205 to the growth process parameters used during formation of the release layer 207. One or a combination of the growth process parameters such as growth temperature, growth rate, pressure of vapor phase reactant and non-reactant materials, ratio of reactant and non-reactant materials in the reaction atmosphere, growth chamber pressure, can be altered to facilitate formation of the release layer 207.

In accordance with a particular embodiment, the formation of the release layer 207 can be facilitated by a change in concentration of a vapor phase reactant material within the reaction chamber from forming the base layer 205 to forming the release layer 207. For example, a particular vapor phase reactant material, such as a dopant material, may be introduced into the reaction chamber to facilitate formation of the release layer 207. In accordance with embodiment, suitable dopants can include elements such as C, Mg, Zn, Si, Sn, O, Fe, Ge, and a combination thereof.

In one particular embodiment, during the formation of the release layer 207, a 2D growth mode can be utilized. In such instances, a dopant material such as Fe, Ge or a combination thereof can be introduced into the growth chamber to facilitate formation of the release layer.

According to another embodiment, the release layer can be formed using a 3D growth mode. Suitable dopant materials for use in 3D growth modes can include O, Ge, and a combination thereof.

The dopant material can be introduced into the reaction chamber at a particular manner to facilitate suitable formation of the release layer 207 having desired characteristics, including for example, absorption coefficient. The dopant material can be injected at a dopant/Ga vapor phase ratio of at least about 0.001 and not greater than about 0.01.

The dopant material can be introduced into the reaction chamber for a particular duration. For example, the dopant can be present within the reaction chamber for a duration of at least about 1 second and not greater than about 5 minutes.

In accordance with embodiment, the release layer 207 can be formed to have a particular concentration of a dopant material. For example, the concentration of a dopant within a release layer 207 can be at least about 2×10$^{18}$ cm$^{-3}$, such as at least about 4×10$^{18}$ cm$^{-3}$, at least about 8×10$^{18}$ cm$^{-3}$, or even at least about 1×10$^{19}$ cm$^{-3}$. Still, the release layer 207 may be formed such as the dopant concentration is not greater than about 1×10$^{21}$ cm$^{-3}$, such as not greater than 1×10$^{20}$ cm$^{-3}$, or even not greater than 5×10$^{19}$ cm$^{-3}$. It will be appreciated that the dopant concentration within the release layer 207 can be within the range between any of the minimum and maximum values noted above.

The release layer can include a Group III-V material including the dopant material. For example, the release layer can include a nitride material. In one instance, the release layer can include gallium, and more particularly may include gallium nitride. In a particular embodiment, the release layer is formed such as it consists essentially of gallium nitride. It will be appreciated that consisting essentially of gallium nitride does allow for the particular concentrations of dopant material described herein.

The release layer can be formed such it has a particular absorption coefficient with respect to radiation of a certain wavelength, including radiation having a wavelength within the visible spectrum. The release layer 207 can be formed such that it absorbs significantly greater amount of radiation than the base layer 205, and as such, the absorption coefficient of the release layer 207 can be significantly greater than the absorption coefficient of the base layer 205.

The release layer can be formed such as it has an absorption coefficient of at least 800 cm$^{-1}$ for radiation within the visible spectrum. In other embodiments, the absorption coefficient of the release layer 207 can be greater, such as at least about 1000 cm$^{-1}$, about 2000 cm$^{-1}$, at least about 3000 cm$^{-1}$, or even at least about 5000 cm$^{-1}$. Still, it will be appreciated that the absorption coefficient of the release layer 207 can be not greater than about 10,000 cm$^{-1}$, such as not greater than about 9,000 cm$^{-1}$, not greater than about 8,000 cm$^{-1}$, or even not greater than about 7,000 cm$^{-1}$, for radiation within the visible spectrum. It will be appreciated that the release layer 207 can be formed such that it has an absorption coefficient within a range between any of the minimum and maximum values noted above.

The release layer 207 can be formed to have a particular average thickness. Notably, the thickness of the release layer 207 can be significantly smaller than the average thickness of the base layer 205. For example, the release layer can have an average thickness of not greater about 100 microns, such as not greater about 80 microns, not greater than about 50 microns, or even not greater than about 30 microns. In other embodiments, the release layer can be formed such as it has an average thickness of at least about 1 micron, such as at least about 2 microns, at least about 3 microns, at least about 5 microns, or even at least about 10 microns. It will be appreciated that the release layer 207 can have an average thickness within the range between any of the minimum or maximum values noted above.

In accordance with embodiment, the release layer 207 can have a particular dislocation density as measure in an upper surface of the layer. For example, the dislocation density at the upper surface of the release layer 207 can be substantially the same as a dislocation density at the upper surface of the base layer 205. For example, the release layer can have a dislocation density that is not greater than about $1 \times 10^8$ dislocations/cm$^2$, such as not greater than about $1 \times 10^7$ dislocations/cm$^2$, or even not greater than about $1 \times 10^6$ dislocations/cm$^2$. In other embodiments, the release layer can have a dislocation density that is at least about $1 \times 10^5$ dislocations/cm$^2$, such as at least $2 \times 10^5$ dislocations/cm$^2$, or even at least $5 \times 10^5$ dislocations/cm$^2$. It will be appreciated the release layer can have a dislocation density within a range between any of the minimum and maximum values noted above.

The release layer 207, depending upon the growth process, may be grown at substantially the same rate as the base layer 205. Notably, it may be preferable that the growth rate is not changed in transitioning from the formation of the base layer 205 to formation of the release layer 207. For example, the release layer 207 can be formed at a growth rate of at least 50 microns per hour. In other embodiments, the rate of forming the release layer 207 can be greater, such as at least about 75 micron per hours, at least about 100 microns per hour, at least about 150 microns per hour, at least about 200 microns per hour, or even at least about 250 microns per hour. In another embodiment, the release layer 207 can be formed at a growth rate of not greater than about 1 mm per hour, such as not greater than 750 microns per hour not great 500 microns per hour, or even not greater than about 300 microns per hour. It will be appreciated the process of forming the release layer can be constructed at a rate within a range within any of the minimum maximum values noted above.

After forming the release layer step 107, the process can continue at step 109 by forming an epitaxial layer overlying the release layer. Referring briefly to FIG. 2A, an epitaxial layer 209 is illustrated as being formed over the release layer 207. In particular instances, the epitaxial layer 209 can be formed such as it is directly contacting the upper surface of the release layer 207. Notably, the release layer 207 can be disposed between the epitaxial layer 209 and the base layer 205.

The process of forming the epitaxial layer 209 can include an epitaxial growth process utilizing one or more growth modes as noted herein. For example, formation of the epitaxial layer 209 can include formation through a 3D growth mode, a 2D growth mode, or a combination of 3D and 2D growth modes. In one embodiment, the formation of the epitaxial layer 209 is completed entirely in a 2D growth mode.

Forming of the epitaxial layer 209 can be conducted via a continuous growth process, such that the epitaxial layer 209 is formed in-situ with the other semiconductive layers (e.g., the base layer 205 and the release layer 207). Notably, the growth process can be continuous and uninterrupted when changing from formation of the release layer 207 to formation of the epitaxial layer 209.

In accordance with an embodiment, forming of the epitaxial layer 209 in the continuous growth process can include changing at least one growth process parameter from the conditions used during formation of the release layer. That is, for example, one or more growth process parameters utilized during growth of the epitaxial layer 209 can differ from one or more growth process parameters used during formation of the release layer 207.

In a particular instance, during formation of the epitaxial layer 209, the concentration of at least one vapor phase reactant can be changed as compared to the concentration of said vapor phase reactant during the growth of the release layer 207. In particular, the change can include a reduction in the concentration of a dopant material present within the reaction chamber during formation of the epitaxial layer 209 as compared to a concentration of the dopant material present in the reaction chamber during formation of the release layer 207. Accordingly, the epitaxial layer 209 can have a composition that is different than the composition of the release layer 207. Notably, the difference in composition can be characterized by at least a difference in the amount of one element, such as a dopant material, between the release layer 207 and the epitaxial layer 209.

In accordance with embodiment, the epitaxial layer 209 can have a dopant concentration that is less than about $5 \times 10^{19}$ cm$^{-3}$. In another embodiment, the dopant concentration within the epitaxial layer 209 can be less, such as not greater than about $2 \times 10^{19}$ cm$^{-3}$, not greater than about $1 \times 10^{19}$, not greater than about $1 \times 10^{18}$, not greater than about $8 \times 10^{17}$ cm$^{-3}$, or even not greater than about $5 \times 10^{17}$ cm$^{-3}$. It will be appreciated that the dopant concentration within the base layer 205 and the epitaxial layer 209 can be substantially the same, and more particularly, significantly less than the dopant concentration within the release layer 207.

In accordance with embodiment, the epitaxial layer 209 can include a Group III-V material. In particular instances, the epitaxial layer can include a nitride material. In still another embodiment, the epitaxial layer can include gallium, and more particularly, may include gallium nitride. Certain epitaxial layers may consist essentially of gallium nitride.

In accordance with embodiment, the epitaxial layer 209 can be grown at substantially the same rate as the release layer 207. Moreover, in certain embodiments, the epitaxial layer 209 can be formed at the same growth rate as the base layer 205.

The epitaxial layer 209 may be formed such it has an average thickness that is significantly greater than the average thickness than the release layer 207. For example, the epitaxial layer 209 can be formed such as it has an average thickness of at least about 5 microns. In other embodiments, the average thickness may be greater, such as at least about 10 microns, at least about 15 microns, at least about 20 microns, at least about 25 microns, at least about 40 microns, at least about 50 microns, or even at least about 100 microns. Still, the epitaxial layer 209 may be formed such that it has an average thickness that is not greater than about 500 microns, such as it is not greater about 400 microns, or even not greater than about 300 microns. It will be appreciated that the epitaxial layer 209 can have an average thickness within a range between any of the minimum and maximum values noted above.

The epitaxial layer of 209 may be formed to have a particular dislocation density as measured in upper surface. In particular embodiments, the epitaxial layer 209 can be formed such that is has a dislocation density that is less than the dislocation density of the release layer 207. Still, in one embodiment the epitaxial layer 209 can have a dislocation density that is not greater than about $1 \times 10^8$ dislocations/cm$^2$, such as not greater than about $1 \times 10^7$ dislocations/cm$^2$, or even not greater than about $1 \times 10^6$ dislocations/cm$^2$. In other embodiments, the epitaxial layer 209 can have a dislocation density that is at least about $1 \times 10^5$ dislocations/cm$^2$, such as at least $2 \times 10^5$ dislocations/cm$^2$, or even at least $5 \times 10^5$ dislocations/cm$^2$. It will be appreciated that the epitaxial layer 209 can have a dislocation density within a range between any of the minimum and maximum values noted above.

The epitaxial layer 209 can be formed such that it has a particular absorption coefficient. Notably, the epitaxial layer 209 can have an absorption coefficient that is significantly less than the absorption coefficient of the release layer 207 with regard to radiation within the visible spectrum. The epitaxial layer 209 may further have an absorption coefficient that is substantially similar to the absorption coefficient of the base layer 205 with respect to radiation within the visible spectrum. In accordance with embodiment, the epitaxial layer can have absorption of not great than about 50 cm$^{-1}$. In other embodiments, the epitaxial layer 209 can have an absorption coefficient of not greater than about 25 cm$^{-1}$, such as not greater than about 15 cm$^{-1}$, not about greater 10 cm$^{-1}$, or even not great than about 5 cm$^{-1}$. In other embodiments the epitaxial layer 209 may have an absorption coefficient that is at least about 0.1 cm$^{-1}$, such as at least 0.2 cm$^{-1}$, at least 0.5 cm$^{-1}$, at least about 1 cm$^{-1}$, or even at least about 2 cm$^{-1}$ for radiation within the visible spectrum. It will be appreciated that the epitaxial layer 209 can have an absorption coefficient within range between any of the minimum and maximum values noted above.

During the process of formation of the semiconductive layers, including for example the base layer 205, release layer 207, and epitaxial layer 209, the substrate 201 may be separated from the plurality of semiconductive layers. The separation can be facilitated by the dissociation of a portion of the buffer layer 203, and particularly, a film within the buffer layer 203. In accordance with an embodiment, the buffer layer 203 can include a film, such as silicon, wherein at elevated temperatures utilized during the continuous growth process, the film is thermally dissociated. Thermal dissociation facilitates separation between the substrate 201 and the plurality of semiconductive layers. Accordingly, upon completion of the continuous growth process, the base layer 205, release layer 207, and epitaxial layer 209 can be completely removed from the substrate 201.

Figure 2B:
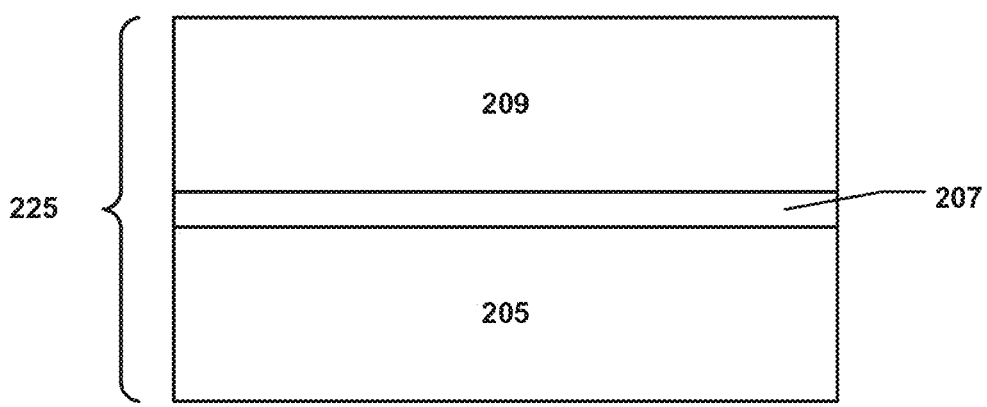

Turning to FIG. 2B, a semiconductor substrate 250 is illustrated having a plurality of semiconductive layers including the base layer 205, release layer 207 and epitaxial layer 209. After formation of the semiconductive substrate and release of the substrate 201 from the plurality of semiconductive layers 225 formed through the continuous growth process, the semiconductive substrate 250 can be further processed. One such process can include grinding of the semiconductive substrate 250 to reduce the overall thickness of the semiconductive layers 225 and improve the quality of the surface for formation of electronic devices thereon.

Figure 2C:
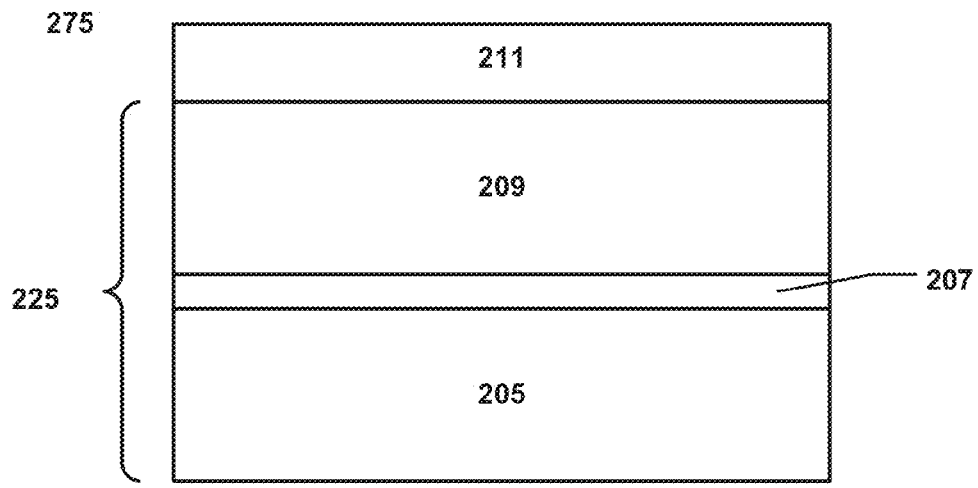

Turning to FIG. 2C, a cross-sectional illustration of a semiconductive substrate including electronic devices formed thereon as illustrated. The semiconductive substrate 275 can have a plurality of semiconductive layers including the base layer 205, release layer 207, and epitaxial layer 209. Furthermore the semiconductive substrate 275 can include an electronic device layer 211 formed on the upper surface of the epitaxial layer 209. Electronic device layer 211 may include devices, such as optoelectronic devices, (e.g., light emitting diodes (LEDs) or laser diodes (LDs)), which can be formed through known techniques.

Figure 2D:
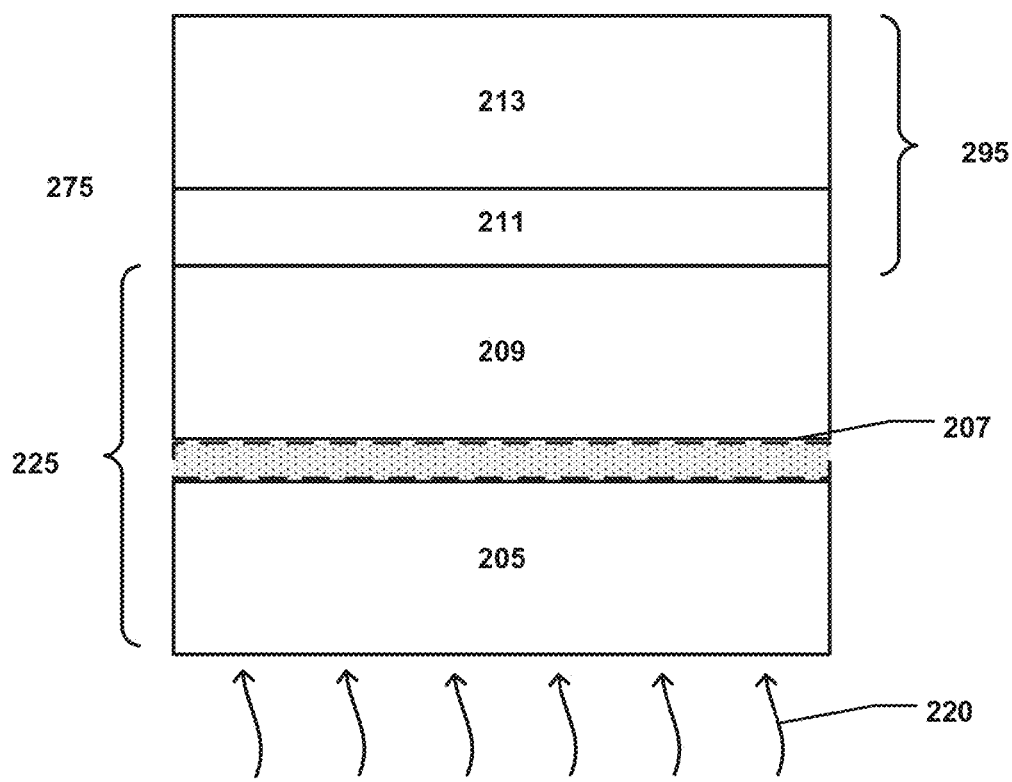

After suitably forming the electronic devices layer 211, a separation process may be undertaken. Separation can include release of at least one of the layers of the semiconductive substrate from the electronic device layer 211. FIG. 2D includes a cross-sectional illustration of a semiconductive substrate having an electronic device layer and undergoing a separation process in accordance with embodiment.

The separation process can include separation between the plurality of semiconductive layers, and notably, separation between the base layer 205 and the epitaxial layer 209 at the release layer. During a separation process, radiation 220 of a particular wavelength, such as a wavelength within the visible portion of the spectrum, impinges upon the release layer 207. While FIG. 2D illustrates directing radiation through the base layer 205, it will be appreciated that the radiation may alternatively be directed through the epitaxial layer 209. The release layer 207 has an absorption coefficient that is significantly greater than the absorption coefficient of the base layer 205 and the epitaxial layer 209, such that the impinging radiation is preferentially absorbed at the release layer 207, causing a change in the chemistry of the release layer 207, and facilitating separation between the base layer 205 and the epitaxial layer 209. In one embodiment, the radiation can cause dissociation of the release layer 207.

After separation of the plurality of semiconductive layers at the release layer 207, the semiconductive device 295 including the epitaxial layer 209, electronic device layer 211, and support layer 213 are suitable for further processing into commercial devices. The base layer 205, which is separated from the semiconductive device 295 can be reclaimed and reused by a suitable manufacturer as a bulk semiconductive substrate or seed material.

Figure 3:
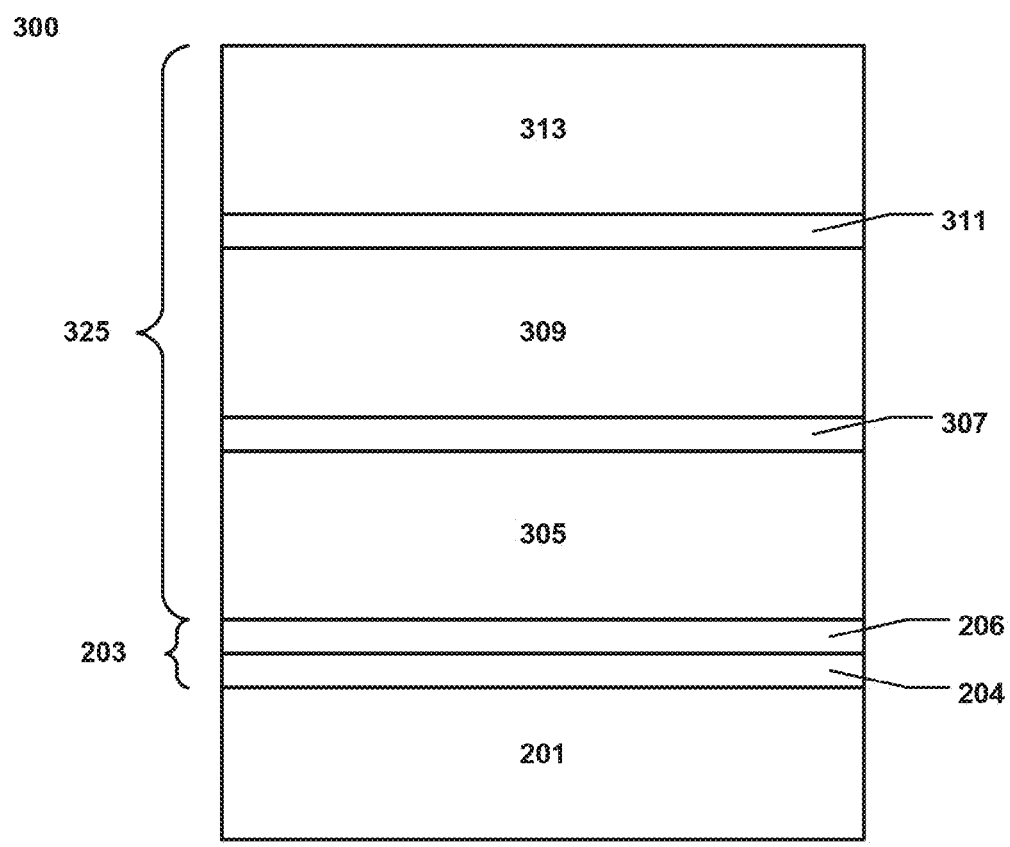
FIG. 3 includes an illustration of a semiconductive device in accordance with embodiment.

FIG. 3 includes a cross-sectional illustration of a semiconductive substrate in accordance with an embodiment. The semiconductive substrate 300 includes a substrate 201, buffer layer 203 having films 204 and 206 overlying the substrate, and a plurality of semiconductive layers 325 overlying the buffer layer 203. The substrate 201 and buffer layer 203 can have the same features as those described in embodiments herein.

The semiconductive layers 325 can be formed according to a continuous growth process, wherein each of the layers are continuously grown over each other without interrupting the deposition or epitaxy process. Notably, each of the layers of the plurality of semiconductive layers 325 can be formed using HVPE.

The semiconductive substrate 300 can include a base layer 305, which is initially formed on the buffer layer 203 and can have the same features of the base layers described in the embodiments herein.

The process of forming the semiconductive substrate 300 includes continuously growing a semiconductive material to form a first release layer 307 over the base layer 305. The first release layer 307 can include a semiconductive material, such as a Group III-V material. The first release layer 307 can have the same features of any release layer described in the embodiments herein.

Notably, formation of the first release layer 307 during the continuous growth process can include changing at least one of the growth parameters used to form the base layer 305. In one particular instance, the formation of the first release layer 307 can include the introduction of a first dopant material into the reaction chamber, such that the first release layer 307 has a unique composition in comparison to the base layer 305 or other surrounding layers in the semiconductive substrate 300. The first release layer 307 can have a particular absorption coefficient with regard to radiation of a particular wavelength.

The process of forming the semiconductive substrate 300 includes continuously growing a semiconductive material to form a first epitaxial layer 309 over the first release layer 307. The first epitaxial layer 309 can include a semiconductive material, such as a Group III-V material. The first epitaxial layer 309 can have the same features of any epitaxial layer described in the embodiments herein.

Notably, formation of the first epitaxial layer 309 during the continuous growth process can include changing at least one of the growth parameters used to form the first release layer 307. In one particular instance, the formation of the first epitaxial layer 309 includes removing a dopant material from the reaction chamber. Accordingly, the first epitaxial layer 309 and the first release layer 307 can have different compositions, notably including at least a difference in the concentration of a dopant material. Furthermore, in certain instances, the first epitaxial layer 309 can have an average thickness that is significantly greater than the average thickness of the first release layer 307.

The process of forming the semiconductive substrate 300 includes continuously growing a semiconductive material to form a second release layer 311 over the first epitaxial layer 309, wherein the first epitaxial layer is disposed between the first and second release layers 307 and 311. The second release layer 311 can include a semiconductive material, such as a Group III-V material. The second release layer 311 can have the same features of any release layer described in the embodiments herein.

Notably, formation of the second release layer 311 during the continuous growth process can include changing at least one of the growth parameters used to form the first epitaxial layer. In one particular instance, the formation of the second release layer 311 can include the introduction of a second dopant material into the reaction chamber, such that the second release layer 311 can have a unique composition in comparison to the base layer 305, the first release layer 307, and/or the first epitaxial layer 309.

The process of forming the semiconductive substrate 300 includes continuously growing a semiconductive material to form a second epitaxial layer 313 over the second release layer 311. Accordingly, the second release layer 311 can be disposed between the first epitaxial layer 309 and the second epitaxial layer 313. The second epitaxial layer 313 can include a semiconductive material, such as a Group III-V material. The second epitaxial layer 313 can have the same features of any epitaxial layer described in the embodiments herein.

Notably, formation of the second epitaxial layer 313 during the continuous growth process can include changing at least one of the growth parameters used to form the second release layer 311. In one particular instance, the formation of the second epitaxial layer 313 includes removing a dopant material from the reaction chamber. Accordingly, the second epitaxial layer 313 and the second release layer 311 can have different compositions, notably including at least a difference in the concentration of a dopant material.

Referring to the first and second release layers 307 and 311, the second dopant material can be the same element or composition as the first dopant material present within the first release layer. Alternatively, in certain instances, the second dopant material can be different than the first dopant material, such that the first release layer 307 and the second release layer 311 can have different compositions. For example, the first dopant material can include a first element and the second dopant material can include a second element different than the first element of the first dopant material.

Moreover, the first release layer 307 and the second release layer 311 can have different concentrations of dopant material with respect to each other, which may facilitate different absorption characteristics between the first and second release layers 307 and 311 for radiation of a particular wavelength. For example, the first release layer 307 can have a first dopant concentration and the second release layer 311 can have a second dopant concentration, wherein the first dopant concentration is different than the second dopant concentration.

Furthermore, the first release layer 307 and the second release layer 311 can have different thicknesses with regard to each other, which may facilitate different absorption characteristics between the first and second release layers 307 and 311 for radiation of a particular wavelength. For example, in one instance the first release layer 307 can have a thickness that is greater than a thickness of the second release layer 311. Alternatively, the first release layer 307 can have a thickness that is less than a thickness of the second release layer 311.

The first and second release layers 307 and 311 can have different absorption coefficients compared to each other for radiation of a particular wavelength. For example, the first release layer 307 can have an absorption coefficient that makes it absorb greater than 50% of a first wavelength of radiation, while the second release layer 311 can have an absorption coefficient that makes it transmit substantially all of the radiation of the first wavelength. Alternatively, or additionally, the second release layer 311 can have an absorption coefficient that makes it absorb greater than 50% of a second wavelength of radiation, while the first release layer 307 can have an absorption coefficient that makes it transmit substantially all of the radiation of the second wavelength.

The selective absorption characteristics of the first and second release layers 307 and 311 facilitates selective separation of the semiconductive substrate 300 based on a selected wavelength of radiation. For example, selecting and impinging a first wavelength of radiation on the first release layer 307 can facilitate separation of the base 305 from the first epitaxial layer 309 and/or other semiconductive layers 325 (i.e., the second release layer 311 and second epitaxial layer 313). Selecting and impinging a second wavelength of radiation on the second release layer 311 can facilitate separation of the second epitaxial layer 313 from the first epitaxial layer 309 and/or other semiconductive layers 325 (e.g., the base 305 and the first release layer).

Selective absorption characteristics of the semiconductive substrate 300 can also facilitate the production of multiple substrates which are ready for device formation. That is, the first and second epitaxial layers 311 and 313 of the semiconductive substrate 300 can be selectively separated and provided to a manufacturer of electronic devices as device-ready substrates. It will be appreciated that while only two release layers are illustrated, more release layers can be formed in a semiconductive substrate in an efficient manner using the continuous growth method disclosed herein.

It will also be appreciated that the formation of semiconductive substrates according to embodiments herein may be achieved without necessarily the creation of an intrinsic mask, modifying the surface of the substrate via grooving or roughening, or utilization of etching techniques.

EXAMPLE

A sample is formed according to an embodiment by first growth of a two part buffer layer via MOVPE on a sapphire substrate. The buffer layer includes a first layer of silicon directly on the sapphire substrate, followed by epitaxial growth of AlN. After loading the sapphire substrate in the MOVPE reactor, the sapphire substrate has to be annealed under $N_2$ before growth of the silicon film. Preferably the temperature 870° C. Silicon growth is formed from pyrolysis of silane in the $N_2$ atmosphere at 100 torrs to a thickness of about 0.4 microns.

The temperature is raised to about 1140° C., the growth vapor still being pure $N_2$ at 70 torrs. $NH_3$ is first introduced into the reaction chamber, and thereafter, a TMAl organometallic material is introduced to begin forming the AlN layer on the silicon. After approximately 20 minutes of growth, a 0.2 μm thick AlN layer is deposited on top of the Si layer, forming the buffer layer.

Manufacturing of an initial base layer is initiated by growth of GaN on the AlN layer via HVPE. Growth is imitated in a 3D growth mode conducted at 950° C. with a growth rate of approximately 150 μm/h. The pressure in the growth chamber is approximately 200 torrs and the V/III ratio is about 10.

After sufficient formation of GaN growth in 3D growth mode, a transition from 3D to 2D growth mode is obtained at a constant low temperature of approximately 950° C. and the growth rate is decreased by a factor 5-6 by decreasing the GaCl partial vapor pressure in the growth chamber. The total pressure in the growth chamber is kept constant.

The growth modes are alternated, such that a base layer of about 1 mm thick is formed using the following sequence: 350 μm 3D+50 μm 2D+350 μm 3D+50 μm 2D+200 μm 3D.

A release layer can be formed without any interruption to the growth of the underlying GaN layer. Growth of the release layer is formed in a continuous growth process using the HVPE process to form the base GaN layer in a 2D growth mode using the same 2D HVPE growth parameters for forming the GaN base layer. During formation of the release layer, a dopant Ge is injected. The dopant material can be injected into the reaction chamber at a dopant/Ga vapor phase ratio of at least about 0.001 to about 0.01 for a duration of approximately 1 second to about 5 min. The concentration of the dopant within a release layer 207 is within a range between approximately $2 \times 10^{18}$ cm$^{-3}$ and $1 \times 10^{21}$ cm$^{-3}$. The release layer is grown such as it has an absorption coefficient of approximately 500 cm$^{-1}$ to 10,000 cm$^{-1}$ for radiation within the visible spectrum. The release layer has a thickness of approximately 10 μm.

After forming the release layer, an epitaxial layer of GaN can be formed via HVPE without interrupting the growth process used to form the base layer and release layer. The epitaxial layer is formed using the same parameters used to growth the GaN base layer, including at least one alternation between 3D and 2D growth modes. The epitaxial layer is formed to have a thickness of approximately 100 μm.

The embodiments herein represent a departure from the state-of-the-art. While certain bulk GaN substrates have been formed to incorporate radiation-sensitive layers (See, for example, US 2010/0219505), such references do not address the challenges associated with embedding release layers during a continuous growth process. The present application discloses a continuous growth process for forming a compound semiconductive substrate comprising a plurality of layers, wherein each of the layers are formed during a continuous growth process and have unique characteristics. Moreover, the continuous growth process of the embodiments herein facilitates the formation of semiconductive substrate having precisely formed and positioned release layers to facilitate further processing or reuse of certain portions of the semiconductive substrate. Prior art methods of forming semiconductive substrates do not remotely address the challenges of properly forming and positioning of layers during a continuous growth process. The continuous growth process of the embodiments herein utilize a particular combination of growth parameters, including growth rate, ratio of reactant materials, ratio of non-reactant materials, growth modes, growth temperatures, growth pressure, and material components. The particular continuous growth process disclosed in the embodiments facilitates formation of semiconductive substrates having a combination of features, including but not limited to, particular layer compositions, average thicknesses of layers, dislocation densities, absorption coefficient, and dopant concentrations.

In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A semiconductor device comprising:
 a base layer comprising a Group III-V material;
 a first release layer comprising a Group III-V material overlying the base layer, wherein the first release layer includes a first dopant material;
 a first epitaxial layer portion comprising a Group III-V material overlying the first release layer;
 a second release layer comprising a Group-III-V material overlying the first epitaxial layer portion, wherein the second release material includes a second dopant material and has a different absorption coefficient compared to the first release layer; and
 a second epitaxial layer portion comprising a Group III-V material overlying the second release layer,
 wherein the first release layer is configured to absorb greater than 50% of radiation of a first wavelength and the second release layer is configured to transmit substantially all of the radiation of the first wavelength.

2. The device of claim 1, wherein the second dopant comprise an element different than the first dopant within the first release layer.

3. The device of claim 1, wherein the first release layer has a first dopant concentration, and the second release layer has a second dopant concentration, the first dopant concentration being different than the second dopant concentration.

4. The device of claim 1, wherein the second release layer is configured to absorb greater than 50% of radiation of a second wavelength different than the first wavelength, and the first release layer is configured to transmit substantially all of the radiation of the second wavelength.

5. The device of claim 1, wherein the base layer comprises GaN.

6. The device of claim 1, wherein the base layer comprises an absorption coefficient of not greater than 50 cm$^{-1}$ for radiation within the visible spectrum.

7. The device of claim 1, wherein the first release layer comprises a dopant selected from the group consisting of C, Mg, Zn, Si, Sn, Fe, O, Ge, and a combination thereof.

8. The device of claim 1, wherein the first release layer comprises a dopant concentration of at least $2 \times 10^{18}$ cm$^{-3}$.

9. The device of claim 1, wherein the first release layer comprises a dopant concentration of not greater than $1 \times 10^{21}$ cm$^{-3}$.

10. The device of claim 1, wherein the first release layer comprises an absorption coefficient of at least about 500 cm$^{-1}$ for radiation within the visible spectrum.

11. The device of claim 1, wherein the first release layer comprises gallium nitride.

12. The device of claim 1, wherein the first epitaxial layer portion comprises a dislocation density within a range between about $1 \times 10^5$ dislocations/cm$^2$ and about $1 \times 10^8$ dislocations/cm$^2$ as measured at an upper surface.

13. The device of claim 1, wherein the first epitaxial layer comprises gallium nitride.

14. The device of claim 1, wherein the first epitaxial layer portion comprises an absorption coefficient of not greater than about 50 cm$^{-1}$ for radiation within the visible spectrum.

15. The device of claim 1, wherein the second release layer comprises an absorption coefficient of at least about 500 cm$^{-1}$ for radiation within the visible spectrum.

16. The device of claim 1, wherein the second dopant material comprises C, Mg, Zn, Si, Sn, Fe, O, Ge, and a combination thereof.

17. The device of claim 1, wherein the second epitaxial layer portion comprises gallium nitride.

18. The device of claim 1, wherein the second epitaxial layer comprises an absorption coefficient of not greater than about 50 cm$^{-1}$ for radiation within the visible spectrum.

19. A semiconductor device comprising:
 a base layer comprising a Group III-V material;
 a first release layer comprising a Group III-V material overlying the base layer, wherein the first release layer comprises an absorption coefficient of at least about 500 cm$^{-1}$ for radiation of a first wavelength;
 a first epitaxial layer portion comprising a Group III-V material overlying the first release layer;
 a second release layer comprising a Group-III-V material overlying the first epitaxial layer portion, wherein the second release layer comprises an absorption coefficient of at least about 500 cm$^{-1}$ for radiation of a second wavelength, wherein the first wavelength is different from the second wavelength; and
 a second epitaxial layer portion comprising a Group III-V material overlying the second release layer.

20. The device of claim 1, the first release layer is configured to absorb greater than 50% of radiation of the first wavelength and the second release layer is configured to transmit substantially all of the radiation of the first wavelength.

* * * * *